United States Patent
Kloeser et al.

[11] Patent Number: 5,833,128
[45] Date of Patent: Nov. 10, 1998

[54] FLUX-FREE CONTACTING OF COMPONENTS

[75] Inventors: Joachim Kloeser; Elke Zakel; Herbert Reichl, all of Berlin, Germany

[73] Assignee: Fraunhofer Gesellschaft zur Forderung der Angewandten Forschung E.V., Munich, Germany

[21] Appl. No.: 685,715

[22] Filed: Jul. 24, 1996

[30] Foreign Application Priority Data

Jul. 25, 1995 [DE] Germany .................. 195 27 172.6
Jul. 17, 1996 [DE] Germany .................. 196 28 702.2

[51] Int. Cl.⁶ ............................. H05K 3/34; H01L 21/60
[52] U.S. Cl. ..................... 228/180.22; 228/254
[58] Field of Search .................. 228/254, 180.22, 228/207, 223

[56] References Cited

U.S. PATENT DOCUMENTS

| | | | |
|---|---|---|---|
| 3,663,184 | 5/1972 | Wood et al. | |
| 5,112,513 | 5/1992 | Bressel et al. | 252/79.1 |
| 5,173,369 | 12/1992 | Kataoka | 428/620 |
| 5,522,000 | 5/1996 | Ayliffe et al. | 385/88 |

FOREIGN PATENT DOCUMENTS

0 341 465  11/1989  European Pat. Off. .

OTHER PUBLICATIONS

Patent Abstracts of Japan, Sasakii Junichi et al. JP 6196486, Publication Date Jul. 15, 1994.

Flip–Chip Bonding on Green Tape Ceramic Substrates, E. Zakel, J. Kloeser, H. Distler and H. Reichl, 9th European Hybrid Microelectronics Conference, pp. 339–350.

Fluxless Flip Chip Assembly on Rigid and Flexible Polymer Substrates Using the Au–Sn Metallurgy, Elke Zakel, Jorg Gwiasda, Joachim Kloeser, Joachim Eldring and Herbert Reichl, Published Sep. 12, 1994 IEEE/CPMT Int'l Electronics Manufacturing Technology Symposum.

Reliability Investigations Fluxless Flip–Chip Interconnections on Green Tape Ceramic Substrates, Joachim Kloeser, Elke Zakel, Franz Bechtold and Herbert Reichl, 45th Electronic Components & Technology Conference, May 21–May 24, 1995, Las Vegas, Nevada, Published 1995.

*Primary Examiner*—Samuel M. Heinrich
*Attorney, Agent, or Firm*—Darby & Darby

[57] ABSTRACT

Method of flux-free contacting of components on a substrate, having the following process steps:
  producing elevated contact metal bumps of a flux-treated gold-tin solder material on tags of the component;
  removing flux residues on the surface of the component;
  melting the elevated contact metal bumps and contacting the contact metal bumps with tags of the substrate.

5 Claims, 3 Drawing Sheets

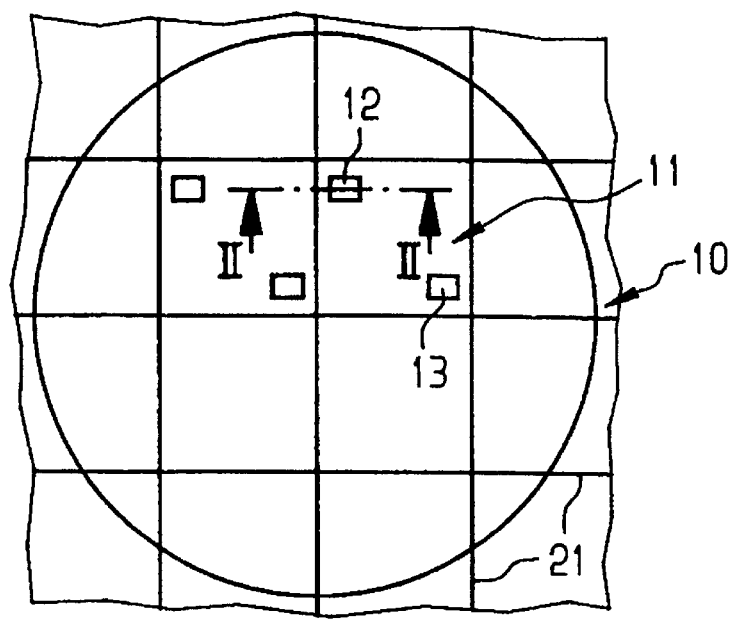
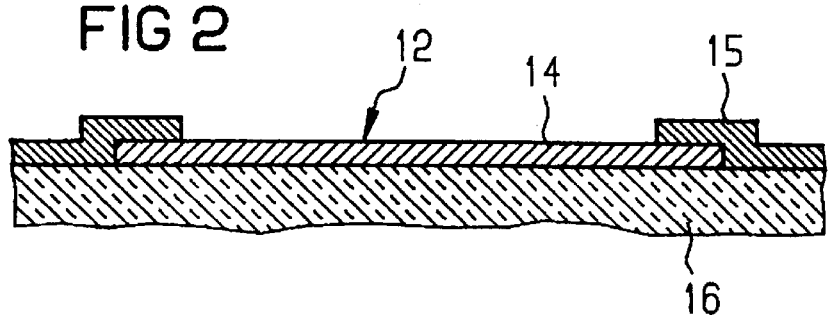
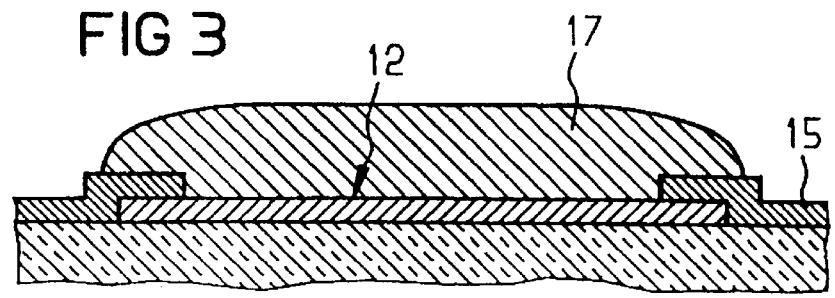

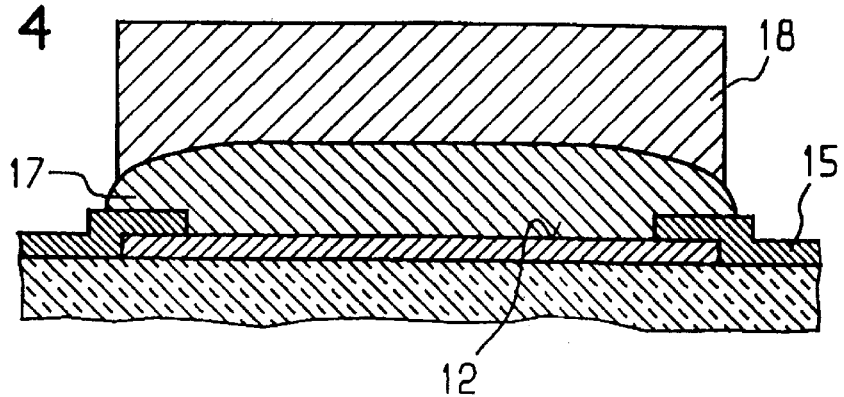
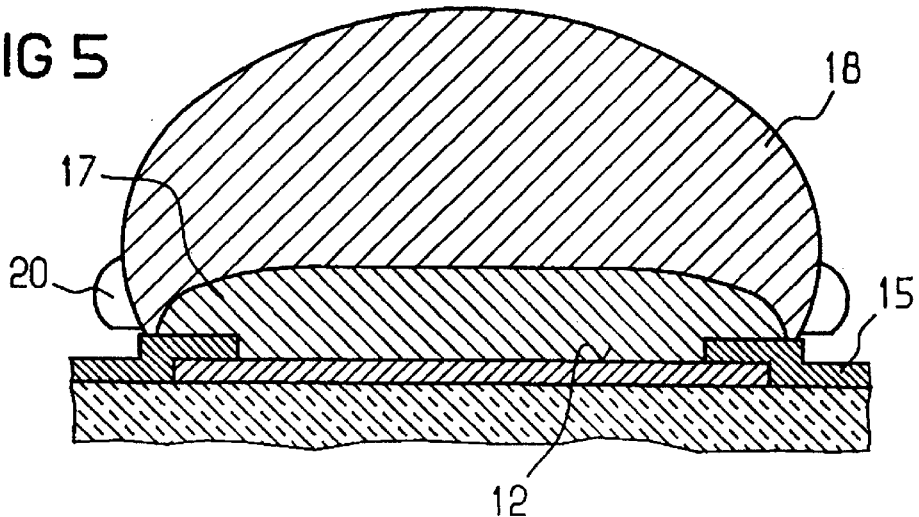
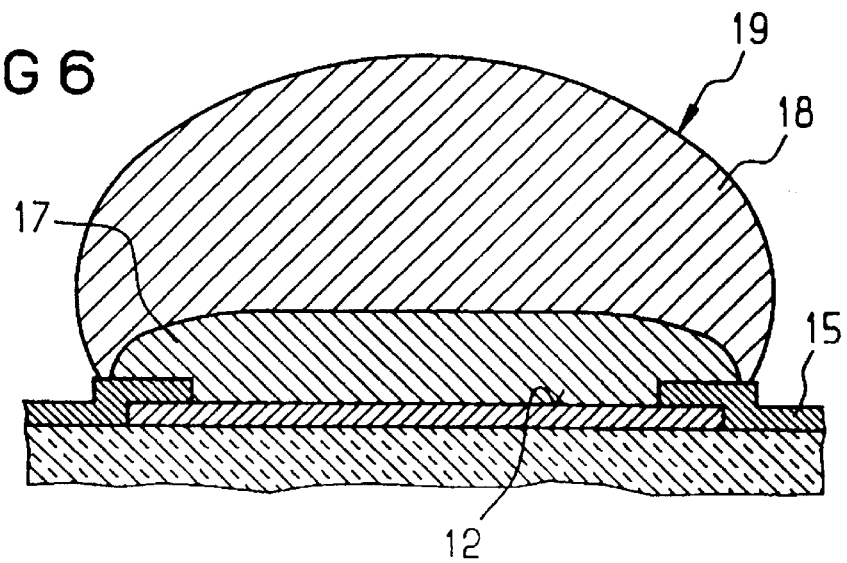

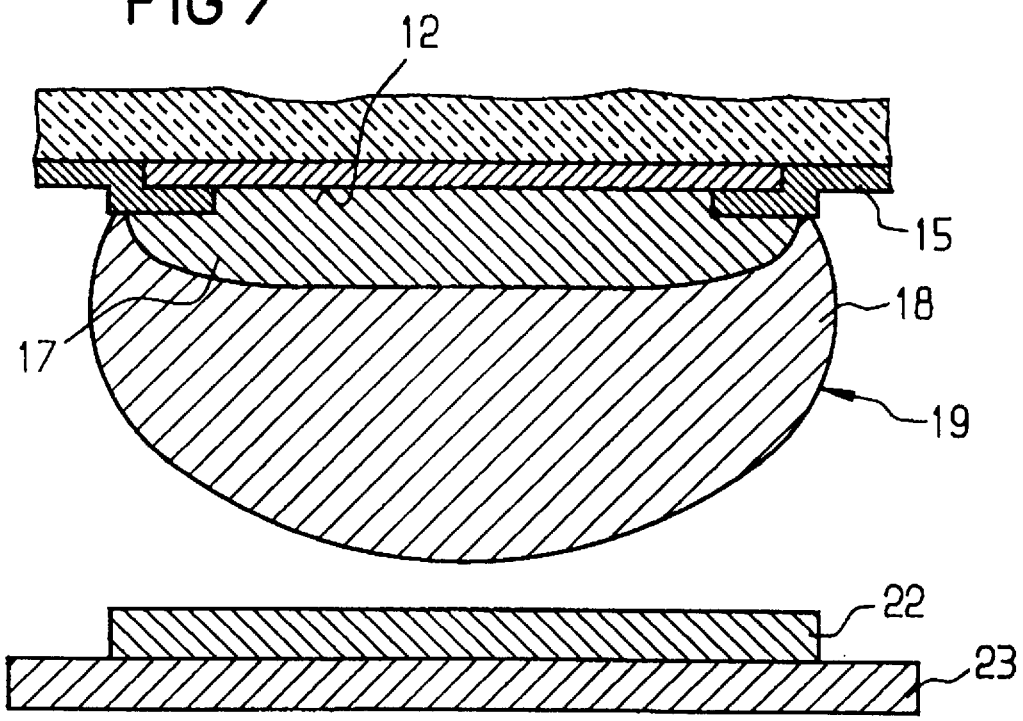
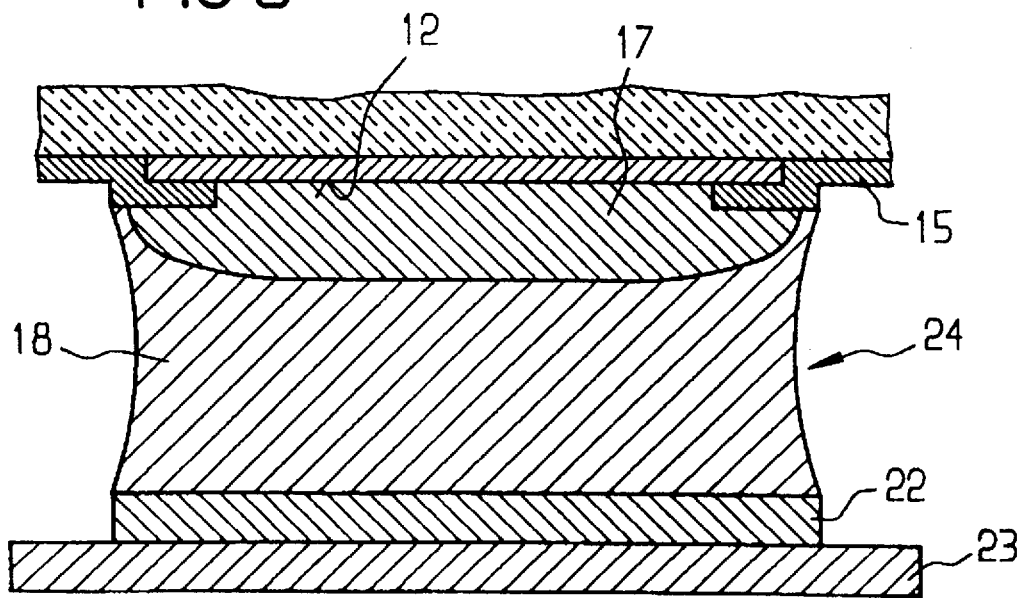

FLUX-FREE CONTACTING OF COMPONENTS

The invention concerns a method of flux-free contacting of components on a substrate.

Flux is used to produce solder joints between the terminal faces, known as tags, of a component and the respective tags of a substrate because flux essentially improves the wettability of metal surfaces with molten solder material. In addition, flux dissolves or washes away from the tags any oxides that might be present or any other covering layers or particles that would interfere with wetting. Finally, the reducing effect of flux prevents oxidation of the heated metal surfaces in contacting. It has proven to be especially important to use fluxes with the high-melting lead-tin alloy materials having a high lead content that are used especially in the flip-chip technology.

These properties of flux, which can be regarded as positive, must be weighed against the negative property that subsequent corrosion of the metal connections between substrate and components can result from flux residues remaining in the area of the connection. These spots of corrosion caused by flux residues seriously detract from the reliability and lifetime of electronic devices composed of substrates and components. Such a device may be, for example, a chip module, i.e., a chip contacted to a carrier substrate. Apart from acting as sources of corrosion, flux residues as such may also lead to unwanted negative effects. With optical components, for example, unwanted clouding effects may also occur.

To prevent or at least restrict the negative corrosion effect caused by flux residues as described above, there has been a trend with component/substrate devices where the functional reliability must meet especially high demands to perform a cleaning of the contact areas to remove flux residues after contacting or even to completely eliminate the use of flux and instead perform the contacting under a protective gas such as an anti-slag gas. The latter method is also very expensive in terms of equipment. On the other hand, however, it has been found that due to the relative inaccessibility of the contact areas, it is very difficult to perform an alternative cleaning of the contact areas to remove flux residues after contacting and therefore this is rarely done thoroughly. Owing to the miniaturized dimensions, there are also small gaps between the component and the substrate that not only make cleaning per se virtually impossible but also interfere with visual inspection of the contact areas for the presence of flux residues.

The preceding discussion plays an important role especially in flip-chip technology, because due to the small dimensions of chips, the gaps formed between the chip and the substrate after contacting are so small that they cannot be cleaned at a justifiable cost for mass production since it would not be economical.

The present invention is therefore based on the object of proposing a process of the type defined initially that will make it superfluous to subsequently clean the contact areas to remove flux residues after contacting without the need for a shielding or protective atmosphere.

This object is achieved with a process by producing elevated contact metal bumps of a flux-treated gold-tin solder material on tags of the component, by removing flux residues remaining on the surface of the component and by melting the elevated contact metal bumps and, further, by contacting the contact metal bumps with tags belonging to the substrate.

The requirement about cleaning contact areas to remove flux residues after contacting is rendered superfluous according to this invention first by the fact that flux residues are removed already from solder material treated with flux after producing elevated contact metal coatings of bumps, so the cleaning can also be performed before contacting and thus when there is good accessibility to the surface of the component intended for contacting. Secondly, the solder material is a gold-tin alloy that has adequate wettability and excellent corrosion resistance after melting the elevated contact metal coatings—even without the use of flux—simply because of the composition of the material. Therefore, a gold-tin alloy is especially suitable for contacting optical components alone or components combined with optical components.

Carrying out the process described above thus results in the fact that there are no flux residues in the contact areas after contacting the component on the substrate.

To produce elevated contact metal coatings, it has proven advantageous if first the flux-treated gold-tin solder material is applied to the contact face of the component and then the elevated contact metal coating is formed in a remelting operation. This procedure offers the advantage that the formation of the elevated contact metal coatings is independent of how the solder material is applied to the contact faces due to the melting operation, which produces the characteristic shape of the contact metal coating. Thus a solder paste application method or screen printing or some other known method of application can be used instead of a molten application, which already yields the characteristic meniscus shape of the elevated contact metal coating.

In addition, it is possible with the preceding embodiment, which has been described as advantageous, as well as when carrying out the process according to claim 1 to select whether to assign the contact metal coatings to the tags of the component or those of the substrate, in other words, to create the contact metal coating not only on the tags of the component but also as an alternative on the tags of the substrate.

It has proven to be especially advantageous—because it is especially economical with regard to performing the cleaning operation—if the components are in an arrangement of several components during the time that the elevated contact metal coatings are being produced and subsequently when the flux residues are being removed, and if the components are not separated into individual components until after the flux residues have been removed, in other words, after the cleaning.

If the components are chips, production of the elevated contact metal coatings and the subsequent removal of flux residues may be performed at the wafer level, in other words, before the chips are isolated from the wafer by cutting, for example.

For cases where the elevated contact metal coatings are to be produced on aluminum tags, it has proven to be advantageous if a nickel interface layer is formed on the tags before the gold-tin solder material is applied. For aluminum tags that are especially susceptible to corrosion, this effectively prevents flux contact when applying flux-treated solder material. The nickel layer forms an almost hermetic shield over the aluminum surfaces.

It has proven especially advantageous if the nickel interface layer is formed on the aluminum tags by autocatalytic deposition. This permits simple nickel coating of the aluminum tags, for example, by deposition of nickel sediment on the tags in a nickel bath.

This process is explained in greater detail below on the basis of an embodiment with reference to the figures, which show the following:

FIG. 1 shows a schematic diagram of a wafer with a chip in an aggregate.

FIG. 2 shows a partial sectional view of a chip according to section II—II in FIG. 1.

FIG. 3 shows the tag illustrated in FIG. 2 with a nickel interface layer applied to it.

FIG. 4 shows the nickel interface layer illustrated in FIG. 3 with solder material applied to it.

FIG. 5 shows the solder material illustrated in FIG. 4, but here it has been melted to form an elevated contact metal coating with flux residues.

FIG. 6 shows the elevated contact metal coating shown in FIG. 5 after cleaning away flux residues.

FIG. 7 shows the contacting of a chip tag with a substrate tag.

FIG. 8 shows a solder material connection between a chip tag and a substrate tag.

FIG. 1 shows a schematic diagram of the surface of a wafer 10 with several chips 11 arranged so they are connected in a wafer aggregate, each chip having several tags 12, 13, although only two are shown here in order to simplify the diagram.

FIG. 2 shows a partial sectional view of a chip 11 in the area of tag 12. Tag 12 is formed by the freely accessible surface of a flat aluminum conductor 14 on the surface (otherwise covered by passivation layer 15) of a silicon body 16 of chip 11 or wafer 10.

FIG. 3 shows the condition of tag 12 after a first phase of a variant of the process of flux-free contacting of components that is presented here as an example, where a nickel interface layer 17 is deposited by an autocatalytic process on tag 12.

FIG. 4 shows the condition of tag 12 after another phase of the process, where a defined amount of a solder material 18 in the form of paste solder is applied to nickel interface layer 17 by means of a stencil application method, for example. Flux additives (not shown here) are present in paste solder material 18. Otherwise, solder material 18 contains at least a large amount of a gold-tin alloy. The amount of flux additive depends on the composition of the solder material which also has a significant effect on the wetting properties.

FIG. 5 shows the condition of tag 12 after melting solder material 18 to form an elevated contact metal coating 19, which is known in the vernacular as a "bump." As FIG. 5 shows, the melting operation causes the flux additives present in solder material 18 to be deposited as flux deposit 20 on the surface of contact metal bump 19.

FIG. 6 shows the condition of contact metal bump 19 after cleaning away flux deposit 20, where this cleaning is performed at a time when chips 11 illustrated in FIG. 1 are still in the wafer aggregate, so wafer 10 is still in its totality. Only thereafter are chips 11 separated, as indicated by dividing lines 21 shown in FIG. 1, and thus the wafer aggregate is broken up.

After separating the chips, as indicated in FIG. 7 on the example of the pairing of tag 12 of chip 11 with tag 22 of substrate 23, the molten contact metal bumps 19 and tags 22 of substrate 23 are contacted. This is accomplished by lowering chip 11 onto substrate 23 from above according to the flip-chip technology.

Finally, FIG. 8 shows a finished soldered connection 24 between tag 12 of chip 11 and tag 22 of substrate 23 with the parabolic constriction typical of this contacting method, which is due to the surface tension of molten contact metal bump 19.

We claim:

1. A process for flux-free contacting of components on a substrate, comprising the following steps:

producing elevated contact metal bumps (19) of a flux-treated gold-tin solder material (18) on tags (12) of a component (11);

subsequently melting the elevated contact metal bumps for contacting the elevated contact metal bumps (19) with tags (22) disposed on the substrate (23) after removing flux residues (20) remaining on the surface of the component (11); and forming the elevated contact metal bumps (19) in a melting operation for depositing flux additives present in the solder material (18) on the surface of the contact metal bumps (19).

2. Process according to claim 1 characterized in that during the production of the elevated contact metal bumps (19) and the subsequent removal of the flux residues (20), several components (11) are in an aggregate (10) and only subsequently are the components (11) separated individually.

3. Process according to claim 2, characterized in that the components are chips (11) that are parts of a wafer (10) before being separated individually.

4. Process according to claim 1, characterized in that in the case of aluminum tags (12), a nickel interface layer (17) is produced on the tags (12) before applying the gold-tin solder material (18).

5. Process according to claim 4, characterized in that the nickel interface layer (17) is produced on the aluminum tag (12) by autocatalytic deposition.

* * * * *